(12) United States Patent
Lin (10) Patent No.: US 10,302,719 B2
(45) Date of Patent: May 28, 2019

(54) GRADIENT AMPLIFIER SYSTEM IN A MRI SYSTEM AND METHOD FOR SUPPLYING CURRENT USING THE SYSTEM

(71) Applicant: KONINKLIJKE PHILIPS N.V., Eindhoven (NL)

(72) Inventor: Yingfeng Lin, Suzhou (CN)

(73) Assignee: Koninklijke Philips N.V., Eindhoven (NL)

( * ) Notice: Subject to any disclaimer, the term of this patent is extended or adjusted under 35 U.S.C. 154(b) by 45 days.

(21) Appl. No.: 15/524,043

(22) PCT Filed: Nov. 9, 2015

(86) PCT No.: PCT/EP2015/076053
§ 371 (c)(1),
(2) Date: May 3, 2017

(87) PCT Pub. No.: WO2016/075076
PCT Pub. Date: May 19, 2016

(65) Prior Publication Data
US 2017/0315188 A1  Nov. 2, 2017

(30) Foreign Application Priority Data

Nov. 11, 2014 (WO) ................ PCT/CN2014/090788
Mar. 24, 2015 (EP) ..................................... 15160448

(51) Int. Cl.
*G01R 33/385* (2006.01)
(52) U.S. Cl.
CPC ................. *G01R 33/3852* (2013.01)
(58) Field of Classification Search
CPC .......... G01R 33/3852; G01R 33/3854
See application file for complete search history.

(56) References Cited

U.S. PATENT DOCUMENTS 6,028,476 A  2/2000  Schweighofer
6,150,821 A  11/2000  Mori et al.
(Continued)

FOREIGN PATENT DOCUMENTS

DE    3926204 A1    2/1991
WO    2011024137 A1    3/2011

OTHER PUBLICATIONS

Sabate J et al: "Ripple cancellation filter for magnetic resonance imaging graiJient amplifiers", 20G4 IEEE Applied Power Electronics Conference and Exposition, APEC 04, IEEE, Anaheim, CA, USA, vol. 2, Feb. 22, 2004 (Feb. 22, 2004), pp. 792-796.
(Continued)

*Primary Examiner* — Rodney A Bonnette (57) ABSTRACT

The present invention provides a gradient amplifier (300) for a magnetic resonance imaging system, comprising: a power amplifier (310) configured to supply a gradient coil current to a gradient coil (330); a passive filter (320) oupled to the power amplifier and configured to damp a harmonic component of the gradient coil current, wherein an oscillation current caused by oscillation of the passive filter (320) is present in the gradient coil current; and an active power filter coupled between the passive filter and the gradient coil and configured to generate a compensation current to compensate the oscillation current. Through incorporating an active power filter to compensate the oscillation current caused by the oscillation of the passive filter, the power consumption for attenuation of the oscillation current may be decreased prominently, the compensation result for the oscillation current may not be substantively affected by the variations of the gradient coil parameter, and reliability of the gradient amplifier is improved.

15 Claims, 11 Drawing Sheets

(56) References Cited

U.S. PATENT DOCUMENTS

| | | |
|---|---|---|
| 6,448,775 B1 | 9/2002 | Lenz |
| 2010/0123356 A1* | 5/2010 | Sihler .................. H02J 3/18 307/105 |
| 2013/0099788 A1 | 4/2013 | Xu et al. |
| 2017/0363698 A1* | 12/2017 | Lin .................. G01R 33/3852 |

OTHER PUBLICATIONS

Watanabe S et al: "Power conversion PWM amplifier with two paralleled four quadrant chopper for MRI gradient coil magnetic field current tracking implementation",Power Electronics Specialists Conference, 1999.PESC 99. 30th Annual IEEE Charleston, SC, USA Jun. 27-Jul. 1, 1999,Piscataway, NJ, USA, IEEE, US,vol. 2. Jun. 27, 1999 (Jun. 27, 1999), pp. 909-913.

Albert C Chow et al: "Design and Evaluation of a Hybrid Passive/Active Ripple Filter with Voltage Injection", IEEE Transactions on Aerospace and Electronic Systems, IEEE Service Center,Piscataway, NJ, US,vol. 39, No. 2, Apr. 1, 2003 (Apr. 1, 2003),pp. 471-480.

Burwen R S: "Kilowatts on order (power amplifiers)",IEEE Spectrum, IEEE Inc. New York, US, vol. 30, No. 2.Feb. 1, 1993 (Feb. 1, 1993), pp. 32-37.

Siqi Li et al: "Stacked high/low voltage level H-bridge circuit for gradient amplifier of MRI system".Electrical Machines and Systems, 2008.ICEMS 2008. International Conference on,IEEE, Piscataway, NJ, USA,Oct. 17, 2008 (Oct. 17, 2008), pp. 2154-2158.

Rafael Concatto Beltrame et al: "Hybrid power amplifiers—a review",Power Electronics Conference (COBEP), 2011 Brazilian, IEEE,Sep. 11, 2011 (Sep. 11, 2011), pp. 189-195.

Jo Kamada et al: "Proposal of switching power amplifier using smal l-capacity linear amplifier and LC filter". Electronics and Communications in Japan,Scriptatechnica. New York, US,vol. 91, No. 10, Oct. 1, 2008 (Oct. 1, 2008), pp. 1-10.

Hafeez K T et al: "Hybrid structured buck converter with ripple cancellation and improved efficiency". 2013 Annual IEEE India Conference (INDICON) IEEE Piscataway, NJ, USA,2013,p. 5.

Sozanski K P Ed—Klumpner C et al:"Improvement of the shunt active power filter dynamic performance". Power Electronics Specialists Conference,2008.PESO 2008. IEEE, IEEE, Piscataway, NJ, USA,Jun. 15, 2008 (Jun. 15, 2008), pp. 3684-3688.

Khadkikar, V. et al "Digital signal processor implementation and performance evaluation of split capacitor, four-leg and three H-bridge based three-phase four-wire shunt active filters" , Power Electronics, IET, vol. 4, Issue: 4, Publication Year: 2011.

Milanes-Montero et al "Hybrid Multiconverter Conditioner Topology for High-Power Applications" , IEEE Transactions on Industrial Electronics vol. 58 , Issue: 6, Publication Year: 2011.

Todeschini et al Transient Response of a Wind Energy Conversion System Used as Active Filter, IEEE Transactions on Energy Conversion, vol. 26 , Issue: 2, Publication Year: 2011.

Pereira et al "New Strategies for Application of Adaptive Filters in Active Power Filters" J.O.P, Industry Applications, IEEE Transactions on, vol. 47, Issue: 3, Publication Year: 2011.

Wang et al "An Active Damper for Stabilizing Power-Electronics-Based AC Systems", IEEE Transactions on Power Electronics, vol. 29 , Issue: 7, Publication Year: 2014.

Wang et al "Characterization, Modeling, and Application of 10-kV SiC MOSFET" IEEE Transactions on Electron Devices, vol. 55 , Issue: 8, Publication Year: 2008.

Funaki et al "Power Conversion with SiC Devices at Extremely High Ambient Temperatures" Power Electronics Specialists Conference, 2005. PESC '05. IEEE 36th, Publication Year: 2005.

* cited by examiner

GRADIENT AMPLIFIER SYSTEM IN A MRI SYSTEM AND METHOD FOR SUPPLYING CURRENT USING THE SYSTEM

CROSS REFERENCE TO RELATED APPLICATIONS

This application is a U.S. national phase application of International Application No. PCT/EP2015/076053, filed on Nov. 9, 2015, which claims the benefit of International Application No. PCT/CN2014/090788 filed Nov. 11, 2014 and EP 15160448.5 filed Mar. 24, 2015 each of which are incorporated herein by reference.

FIELD OF THE INVENTION

The invention relates to a magnetic resonance imaging (MRI) system, and particularly to a gradient amplifier system in the MRI system and a method for supplying a current to a gradient coil of the MRI system.

BACKGROUND OF THE INVENTION

Magnetic Resonance Imaging uses magnetic field gradients to do spatial encoding for imaging. The gradient coils are driven by gradient amplifiers to provide accurate currents with fidelity to commanded values that meet magnetic resonance imaging requirements.

However, due to high frequency switching characteristics of the gradient amplifiers, common mode and differential mode harmonic currents that lead to poor imaging quality are generated in gradient coil currents. Harmonics are a mathematical way of describing distortion to a voltage or current waveform. A harmonic current present onto a gradient amplifier refer to a harmonic component of a gradient coil current that occurs at an integer multiple of the fundamental frequency. As is commonly known, power system harmonics is receiving a great deal of attention and various techniques have been implemented to reduce harmonic currents present onto utility power systems, e.g., passive filtration, active filtration and current wave shaping systems. However, power system harmonics are caused by non-linear loads and are integer multiples of a steady fundamental frequency, such as 50 Hz or 60 Hz. While, gradient amplifier harmonics are caused by high frequency switching and the fundamental frequency is varies with frequencies of imaging acquisition sequences. Due to different causes and different characteristics of harmonics, these techniques are not applicable to reduction of harmonic currents present onto MRI gradient amplifier system. Main manufactures of MRI system, such as Siemens, General Electric (GE), Analogic, Hitachi, and so on, all employ passive electromagnetic interference (EMI) filters in the gradient amplifier system.

Figure 1:
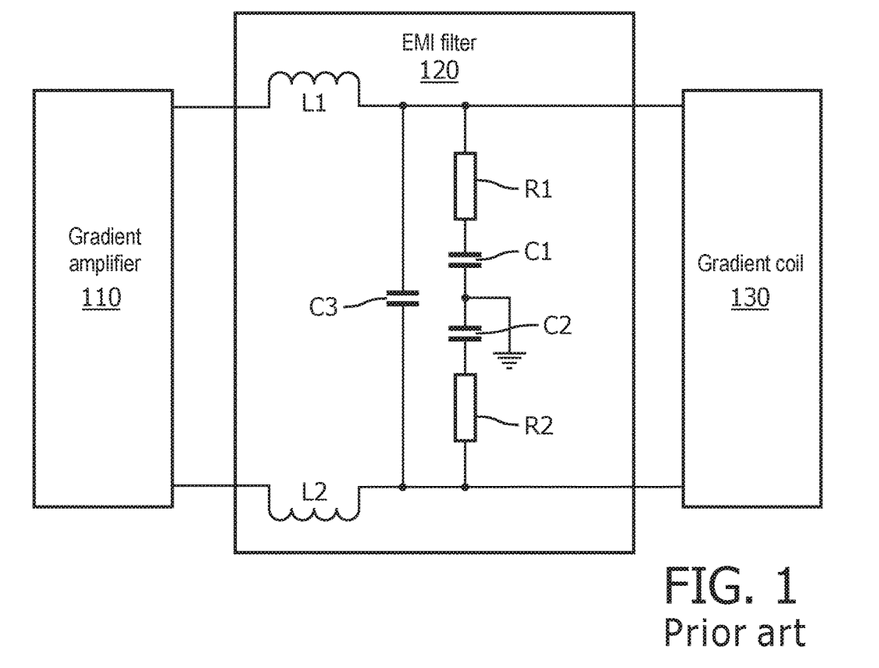
FIG. 1 illustrates a gradient amplifier system using a passive EMI filter in prior art.

As shown in FIG. 1, an EMI filter 120 is coupled between the gradient amplifier 110 and the gradient coil 130. The EMI filter 120 typically consists of RLC elements, such as inductors L1, L2, damping resistors R1, R2 and capacitors C1, C2, C3.

Figure 2A:
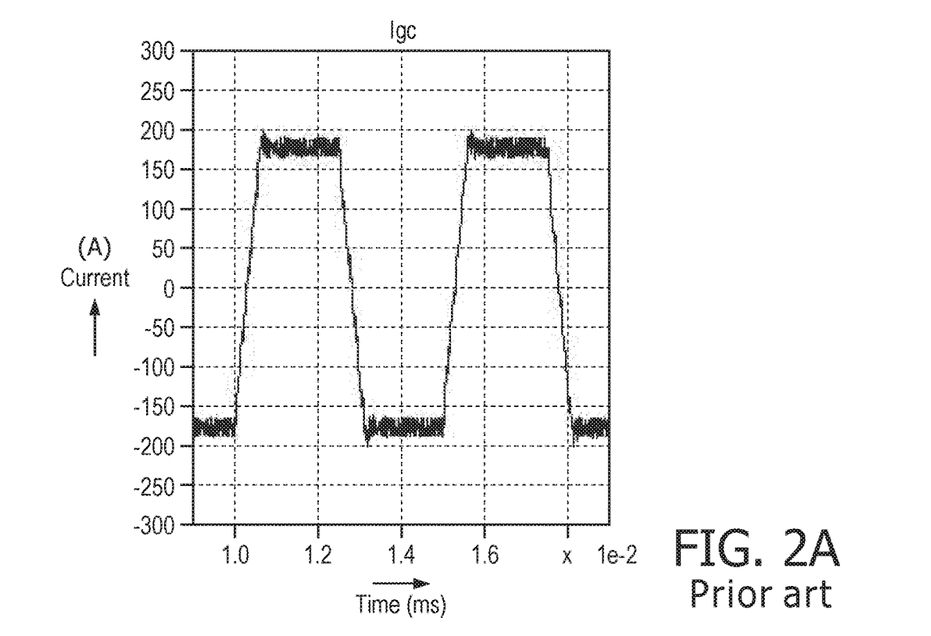
FIG. 2A illustrates an oscillation current caused by the LC oscillations in an EMI filter.
Figure 2B:
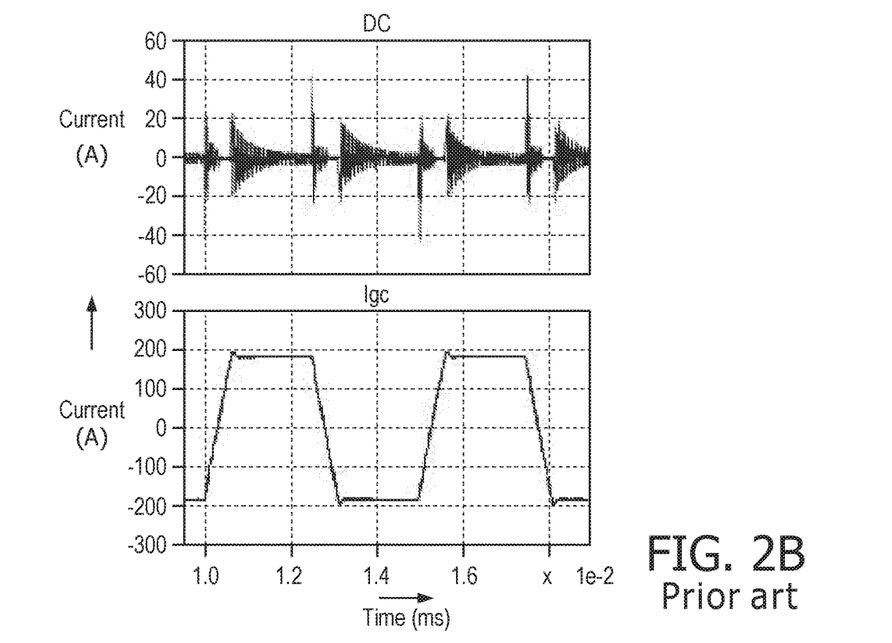
FIG. 2B illustrates damping of an oscillation current by damping resistors in a passive EMI filter.

The LC filter consisting of L1C1 and L2C2 is used to filter the harmonic current, however the LC filter may introduce LC oscillation current into the coil current while filtering the harmonic current. That's why the damping resistors R1 and R2 are used in the EMI filter. As shown in FIG. 2A, if the damping resistors R1 and R2 are not included in the EMI filter, LC oscillation current appears in the gradient coil current Igc. And as shown in FIG. 2B, the damping resistors R1 and R2 may attenuate the LC oscillation current overlapped on the gradient coil current Igc by introducing a damping current DC.

SUMMARY OF THE INVENTION

However the inventor of the present application realizes that the large resistance values of the damping resistors R1 and R2 result in poor energy efficiency, for example, in the EMI filter as shown in FIG. 1, only 1Ω for both R1 and R2 generates additional 72 W power loss.

Figure 2C:
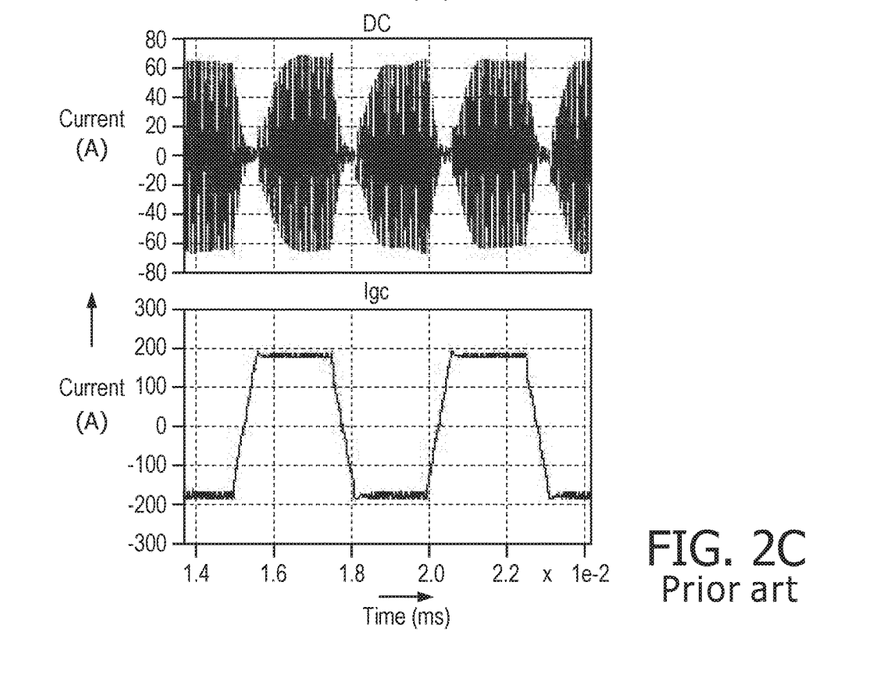
FIG. 2C illustrates damping of an oscillation current by damping resistors in a passive EMI filter when gradient coil parameters have variations.

The inventor also realizes another problem of the passive EMI filter that may be caused by the variation of the gradient coil parameters. Typically the gradient coil parameters, which are equivalent to inductance and resistance, have at least ±10% variation. With a large variation, the damping resistors R1 and R2 in the traditional passive EMI filter may not be able to attenuate the oscillation current effectively. As show in FIG. 2C, the oscillation current appearing on the gradient coil current Igc is not sufficiently attenuated by the damping current DC. And the LC oscillations result in much higher current flowing through damping resistors, and in this example leading to over 1.2 KW power loss of each damping resistor.

In view of the problem as mentioned above, the present invention provides a solution, which may improve the energy efficiency and may improve the robustness by incorporating an active power filter. Alternatively, by using the active power filter together with an LC filter, the need for a damping resistor is avoided, and thereby the power loss arising from the damping resistor can be avoided.

According to one aspect of the present invention, it provides a gradient amplifier for a magnetic resonance imaging system, the gradient amplifier comprises a power amplifier configured to supply a gradient coil current to a gradient coil; a passive filter coupled to the power amplifier and configured to damp a harmonic component of the gradient coil current, wherein an oscillation current caused by oscillation of the passive filter is present in the gradient coil current; and an active power filter coupled between the passive filter and the gradient coil and configured to generate a compensation current to compensate the oscillation current.

Through incorporating an active power filter to compensate the oscillation current caused by the oscillation of the passive filter, the power consumption for attenuation of the oscillation current may be decreased prominently, and the compensation result for the oscillation current may not be substantively affected by the variations of the gradient coil parameter. More particularly, by using the active power filter together with an LC filter without a damping resistor, the power loss arising from the damping resistor can be avoided.

According to one aspect of the present invention, the active power filter comprises an inverter configured to output a first voltage based on a difference between the gradient coil current and a predetermined reference current; a transformer configured to boost the first voltage to a second voltage; and an inductor circuit driven by the second voltage to generate the compensation current.

Through tracking the difference between the gradient coil current and the predetermined reference current, an appropriate compensation current may be generated based on the tracking to compensate the oscillation current. Because the compensation is performed based on tracking the gradient coil current, the compensation result may be robust even if there are large variations of the gradient coil parameter.

According to one aspect of the present invention, the inductor circuit comprises a first inductor and a second inductor, and the transformer comprises a first secondary winding and a second secondary winding, and wherein the first secondary winding, the first inductor, the gradient coil, the second inductor and the secondary winding are coupled in series sequentially, a junction node of the first and secondary windings is coupled to ground, and central of the gradient coil is coupled to ground.

In the preferred structure of the transformer, the inductor circuit and the gradient coil, various tracking algorithm may be implemented and the compensation of the oscillation current may be implemented effectively.

According to one aspect of the present invention, the gradient amplifier may comprises a controller configured to generate a drive signal for the inverter, and wherein a duty cycle of the drive signal is determined by the difference between the gradient coil current and the predetermined reference current.

The controller may be one of a digital signal processor (DSP), a central processing unit (CPU), a general purpose processor and so on used to generate the drive signals based on the tracking of the gradient coil current. Under the driving of the generated drive signals, an appropriate compensation current may be generated by the inverter, the compensation result may be robust and the power consumption may be efficient.

According to one aspect of the present invention, the inverter comprises a H bridge inverter including a first half bridge with a high side transistor and a low side transistor coupled in series and a second half bridge with a high side transistor and a low side transistor coupled in series, and wherein the high side transistor and the low side transistor in each of the first and second half bridges are switched on alternately, and drive signals for the high side transistor in the first half bridge and the low side transistor in the second half bridge have the same duty cycle and a 180° phase shift with each other.

By using the preferred structure of the inverter and the drive signals having the relationship as mentioned above, the inverter may produce a proper compensation waveform effectively.

According to one aspect of the present invention, each of the transistors in the H bridge inverter is coupled in parallel with an integrated diode.

The integrated diode here is important for energy efficiency. With this structure, synchronous drive technology may be enabled to reduce the power loss.

According to one aspect of the present invention, the compensation current and the oscillation current have the same magnitude, and wherein the compensation current and the oscillation current are out of phase with each other.

In this way, the oscillation current may be compensated or canceled effectively from the gradient coil current.

According to one aspect of the present invention, it provides a method for supplying a current to a gradient coil in a gradient amplifier of a magnetic resonance imaging system. The method comprises supplying, by a power amplifier, a gradient coil current to a gradient coil; damping, by a passive filter coupled to the gradient amplifier, a harmonic component of the gradient coil current, wherein an oscillation current caused by oscillation of the passive filter is present in the gradient coil current; and generating, by an active power filter coupled between the passive filter and the gradient coil, a compensation current to compensate the oscillation current.

Through incorporating an active power filter to compensate the oscillation current caused by the oscillation of the passive filter, the power consumption for attenuation of the oscillation current may be decreased prominently, and the compensation result for the oscillation current may not be substantively affected by the variations of the gradient coil parameter. More particularly, by using the active power filter together with an LC filter without a damping resistor, the power loss arising from the damping resistor can be avoided.

According to one aspect of the present invention, the active power filter comprises an inverter, a transformer and an inductor circuit. The generating the compensation current further comprises: generating, by the inverter, a first voltage based on a difference between the gradient coil current and a predetermined reference current; boosting, by the transformer, the first voltage to a second voltage; and driving the inductor circuit by the second voltage to generate the compensation current.

According to one aspect of the present invention, the method further comprises generating, by a controller, a drive signal for the inverter, and wherein a duty cycle of the drive signal is determined by the difference between the gradient coil current and the predetermined reference current.

According to one aspect of the present invention, the inverter comprises a H bridge inverter including a first half bridge with a high side transistor and a low side transistor coupled in series and a second half bridge with a high side transistor and a low side transistor coupled in series. The generating the first voltage further comprises driving the high side transistor and the low side transistor in each of the first and second half bridges by drive signals to switch on alternately, and drive signals for the high side transistor in the first half bridge and the low side transistor in the second half bridge have the same duty cycle and a 180° phase shift with each other.

Other objects and advantages of the present invention will become more apparent and will be easily understood with reference to the description made in combination with the accompanying drawings.

DESCRIPTION OF THE DRAWINGS

The present invention will be described and explained hereinafter in more detail in combination with embodiments and with reference to the drawings, wherein.

The same reference signs in the figures indicate similar or corresponding feature and/or functionality.

DETAILED DESCRIPTION

The embodiment of the present invention will be described hereinafter in more detail with reference to the drawings.

Figure 3A:
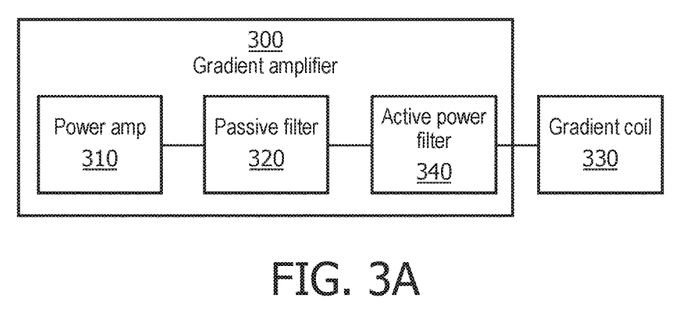
FIG. 3A illustrates a gradient amplifier in a MRI system in accordance with an embodiment of the present invention.

FIG. 3A illustrates a gradient amplifier 300 used in a MRI system in accordance with an embodiment of the present invention. The gradient amplifier 300 comprising a power amplifier 310, a passive filter 320, and an active power filter 340 may provide a current with various accurate waveforms to the gradient coil 330.

Figure 3B:
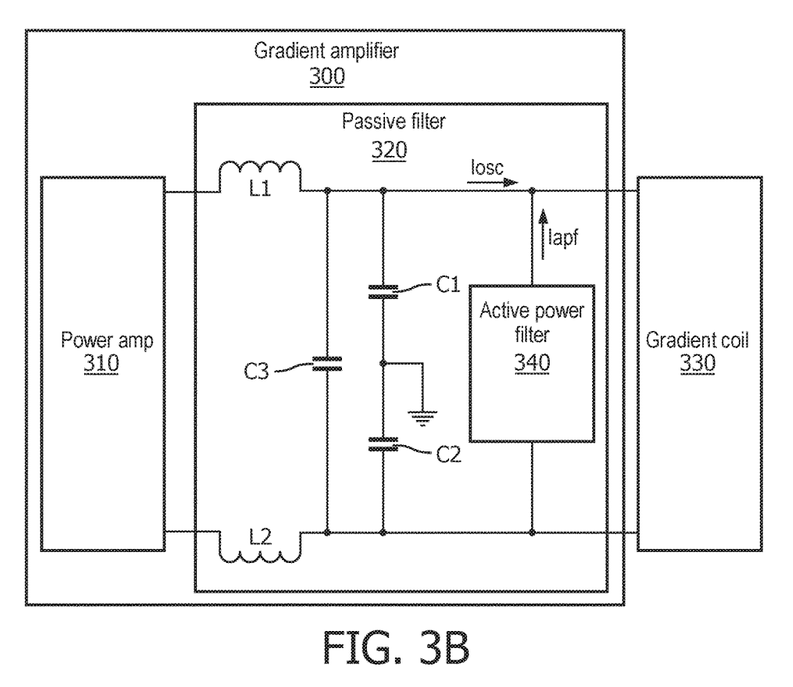
FIG. 3B illustrates a gradient amplifier in a MRI system in accordance with an embodiment of the present invention.

FIG. 3B illustrates an example of gradient amplifier 300 in more details in accordance with an embodiment of the present invention. It should be understood that the passive 320 does not limited to the specific structure as shown in FIG. 3B, other structures of the passive filter may also be used in the gradient amplifier system.

The power amplifier 310 may be configured to supply a gradient coil current to the gradient coil 330. The passive filter 320 is coupled to the power amplifier 310 and may be configured to damp a harmonic component of the gradient coil current. In one embodiment, the passive filter 320 is an LC filter without using a damping resistor as shown in FIG. 3B. An oscillation current Iosc caused by oscillation of the passive filter, particularly by the LC oscillation of L1C1 and L2C2, is present in the gradient coil current. The active power filter 340 coupled between the passive filter 320 and the gradient coil 330 may be configured to generate a compensation current Iapf to compensate the oscillation current Iosc.

Figure 3C:
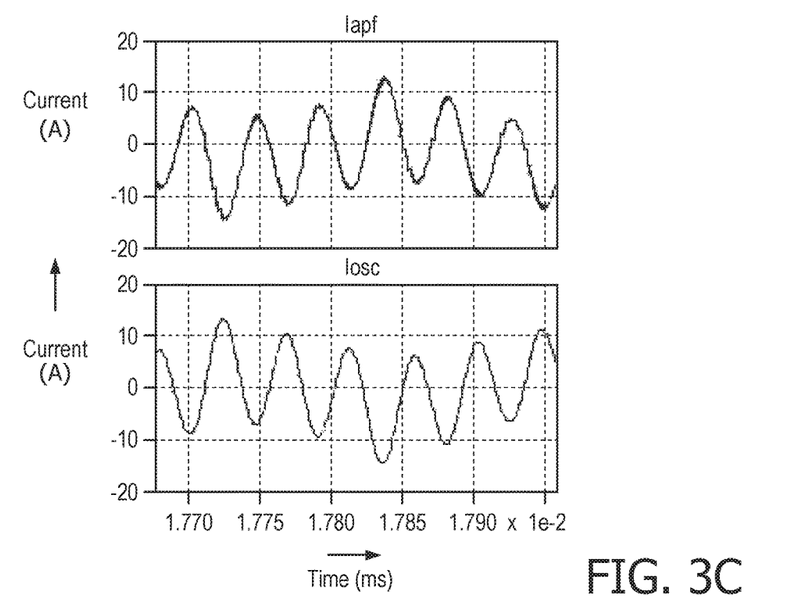
FIG. 3C illustrates an oscillation current and a compensation current for compensating the oscillation current in accordance with an embodiment of the present invention.
Figure 3D:
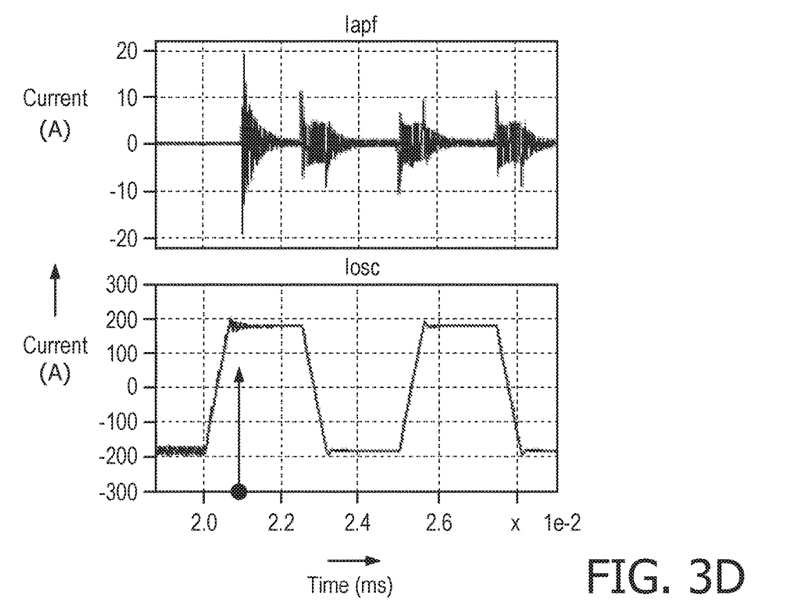
FIG. 3D illustrate compensation of an oscillation current by an active power filter in accordance with an embodiment of the present invention.

As shown in FIG. 3C, the compensation current Iapf and the oscillation current Iosc have substantially same magnitude and are out of phase with each other. In this way, the oscillation current Iosc may be compensated or canceled from the gradient coil current effectively, as illustrated in FIG. 3D which shows the compensation current Iapf and the gradient coil current Igc. The arrow in the FIG. 3D indicates the compensation enabling point.

Advantageously, by using the active power filter 340 and the passive filter 320 without the damping resistor, power loss arising from the damping resistor can be avoided so as to improve the power efficiency. Moreover, owing to the active injection of compensation current, the oscillation current present in the gradient coil can always be tracked and compensated regardless of variation in the gradient coil parameters, thereby enhancing robustness of the gradient amplifier.

Alternatively, even if the damping resistor is present in the passive filter 320, e.g., using the conventional passive EMI filter, the active power filter 340 can effectively mitigate the drawbacks of the EMI filter by generating the compensation current to compensate the oscillation current automatically to reduce the harmonics in a more efficient way. What is more, the active power filter 340 offers additional value added features. The value-added features include enhanced robustness to variation in the gradient coil parameters, self adaptivity to harmonics, and reliability in advanced MRI applications. In particular, for some advanced MRI applications, the frequency of current sequence of the gradient amplifier can be up to 4 KHz. For such a high frequency, the damping resistor in the conventional EMI filter may be damaged due to severe power loss. In this instance, introduction of the active filter 340 is essential for preventing the damping resistor from damage.

Figure 4A:
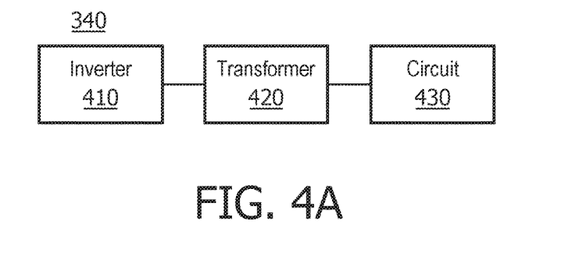
FIG. 4A illustrates an active power filter used in a gradient amplifier in accordance with an embodiment of the present invention.

FIG. 4A illustrates an active power filter 340 used in the gradient amplifier 300 in accordance with an embodiment of the present invention. The active power filter 340 may include an inverter 410, a transformer 420, and an inductor circuit 430. The inverter 410 may be a high frequency inverter configured to output a first voltage based on a difference between the gradient coil current and a predetermined reference current for the gradient coil 330. The transformer 420 may be configured to boost the first voltage to a second voltage. The inductor circuit 430 may be driven by the second voltage to generate the compensation current for compensating the oscillation current.

Figure 4B:
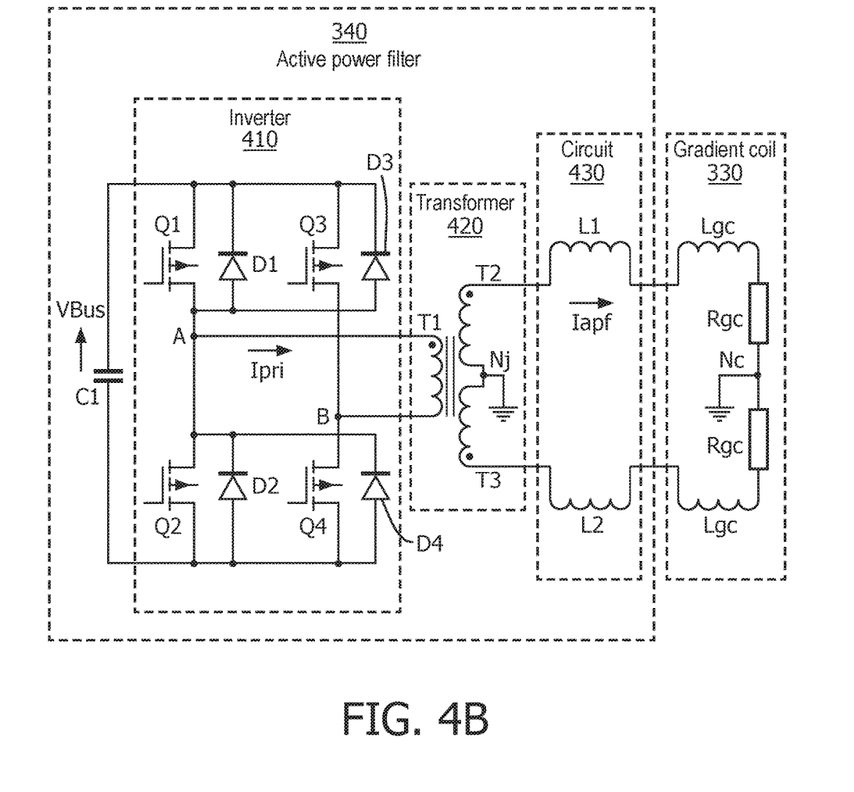
FIG. 4B illustrates an active power filter used in a gradient amplifier in accordance with an embodiment of the present invention.

FIG. 4B illustrates an example of the active power filter 340 used in the gradient amplifier 300 in accordance with an embodiment of the present invention. As shown in FIG. 4B, the active power filter 340 is coupled to the gradient coil 330. It should be understand that the illustrated gradient coil 330 consisting of Lgc and Rgc is an equivalent circuit in order to indicate the gradient coil parameters, that is, inductance Lgc and resistance Rgc. The gradient coil physically should be a coil.

As shown in FIG. 4B, the output of the inverter 410 may be coupled to the primary winding of the transformer 420. The transformer 420 comprises the primary winding T1, a first secondary winding T2 and a second secondary winding T3. The inductor circuit 430 comprises a first inductor L1 and a second inductor L2. In this embodiment, the first secondary winding of the transformer 420, the first inductor of the inductor circuit 430, the gradient coil 330, the second inductor of the inductor circuit 430, and the secondary winding of the transformer 420 are coupled in series sequentially. A junction node Nj of the first and secondary windings of the transformer 420 is coupled to ground, and a central point Nc of the gradient coil is coupled to ground. The illustrated structure may facilitate the control of the active power filter in the gradient amplifier system of the MRI system.

In an embodiment, the inverter 410 may be an H bridge inverter which is driven by drive signals and outputs a primary voltage VAB to the transformer 420. As shown in the FIG. 4B, the H bridge inverter 410 may include a first half bridge and a second half bridge. The first half bridge includes a high side transistor Q1 and a low side transistor Q2 coupled in series, and the second half bridge includes a high side transistor Q3 and a low side transistor Q4 coupled in series. The transistors are used as high frequency switches to output a voltage with required waveform under the control of the drive signals.

The high side transistor and the low side transistor in each of the first and second half bridges are switched-on alternately by respective drive signals, and the drive signals for the high side transistor in the first half bridge and the low side transistor in the second half bridge have the same duty cycle and a 180° phase shift with each other. And in order to switch on the high side transistor and the low side transistor in each of the first and second half bridges in an alternate way, the drive signals for the high side transistor and the low side transistor in the half bridge should be out of phase, in other words, be opposite in phase.

As shown in FIG. 4B, each of the transistors Q1 to Q4 in the H bridge inverter is coupled in parallel with one of diodes D1 to D4. The diode may be an integrated diode which is packed together with the corresponding transistor within a MOSFET.

Each of the transistors Q1 to Q4 in the inverter 410 may be coupled to a transistor driver such as a MOSFET driver, which is not shown for sake of simplicity. The drivers may be configured to receive the digital drive signals and generate driving signals high enough to switch on the transistors.

Figure 4C:
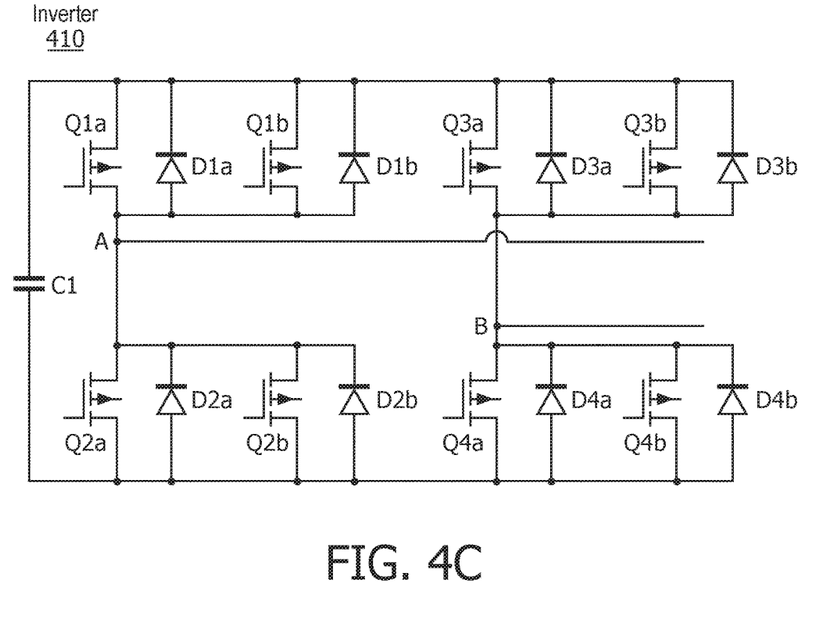
FIG. 4C illustrates an exemplary structure of an inverter in an active power filter in accordance with an embodiment of the present invention.

The inverter 410 is not limited to the structure of the H bridge inverter as shown in FIG. 4B. FIG. 4C illustrates an example of inverter 410. In the H bridge inverter as shown in FIG. 4C, each half bridge leg includes two high side transistors coupled in parallel and two low side transistors couple in parallel. In other words, the H bridge inverter as shown in FIG. 4C may be obtained by expanding each switching transistor of the H bridge inverter as shown in FIG. 4B to two transistors coupled in parallel. It should be understood that the each switching transistor may be expanded to more than two transistors coupled in parallel as well. By using this structure as shown in FIG. 4C, if higher power rating or higher current is needed for the inverter but cannot be afforded by a single transistor, the inverter may be expanded easily to afford the higher load.

It should be understood that the inverter 410 does not limited to a specific structure, other kinds of inverters may also be used in the active power filter. For example, the high frequency inverter 410 may be implemented as a neutral-point-clamped (NPC) inverter, or may be implemented as a cascaded H-bridge inverter consisting of multiple cascaded H-bridge inverters.

The active power filter 340 may comprise a power rectifier which is not show in the drawing for sake of simplicity. The power rectifier may be used to regulate alternating current (AC) voltage into DC bus voltage VBus to provide a DC power supply for the inverter 410.

In an embodiment, the gradient amplifier 300 may comprise a controller which is not shown in the drawings for sake of simplicity. The controller may be included in the gradient amplifier system or may be not a part of the gradient amplifier system, depending on specific design. The controller may be DSP, CUP, or general purpose processor, or the like. The controller is configured to track the compensation current Iapf supplied by the active power filter based on the difference of the gradient coil current and the predetermined reference current of the gradient coil. Particularly, the controller may generate drive signal for the inverter 410 to drive the inverter 410 to supply the compensation current Iapf with the aid of the transformer 420 and the inductor circuit 430. The duty cycle of the drive signal is determined eventually by the difference between the gradient coil current and the predetermined reference current.

Figure 5A:
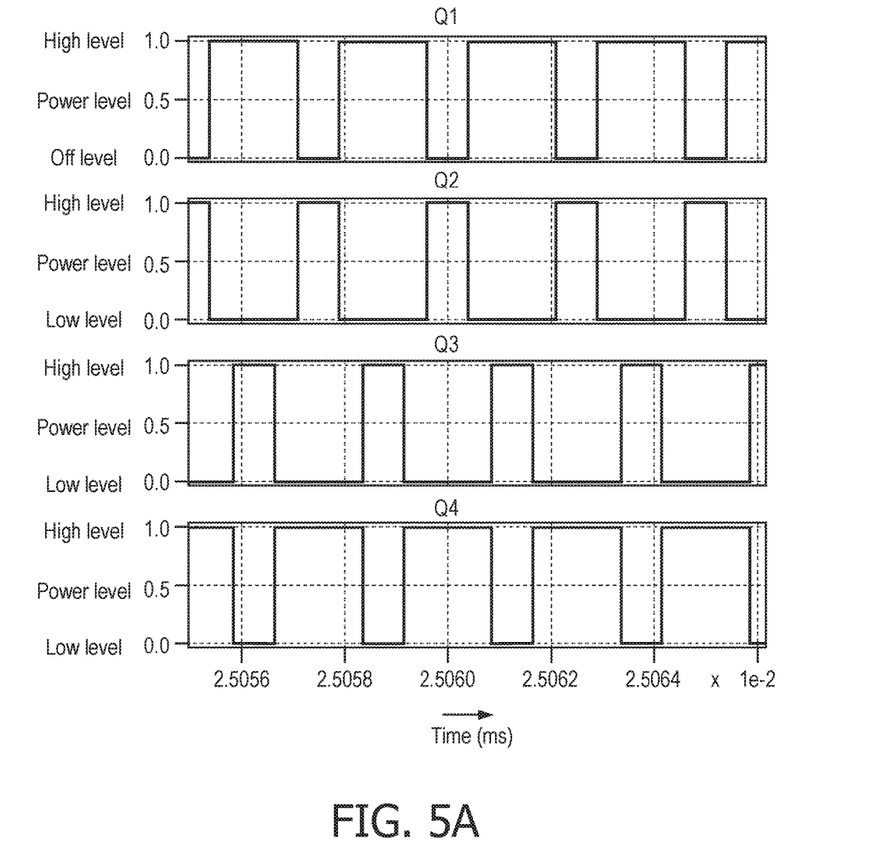
FIG. 5A illustrates exemplary drive signals for driving an inverter in accordance with an embodiment of the present invention.
Figure 5B:
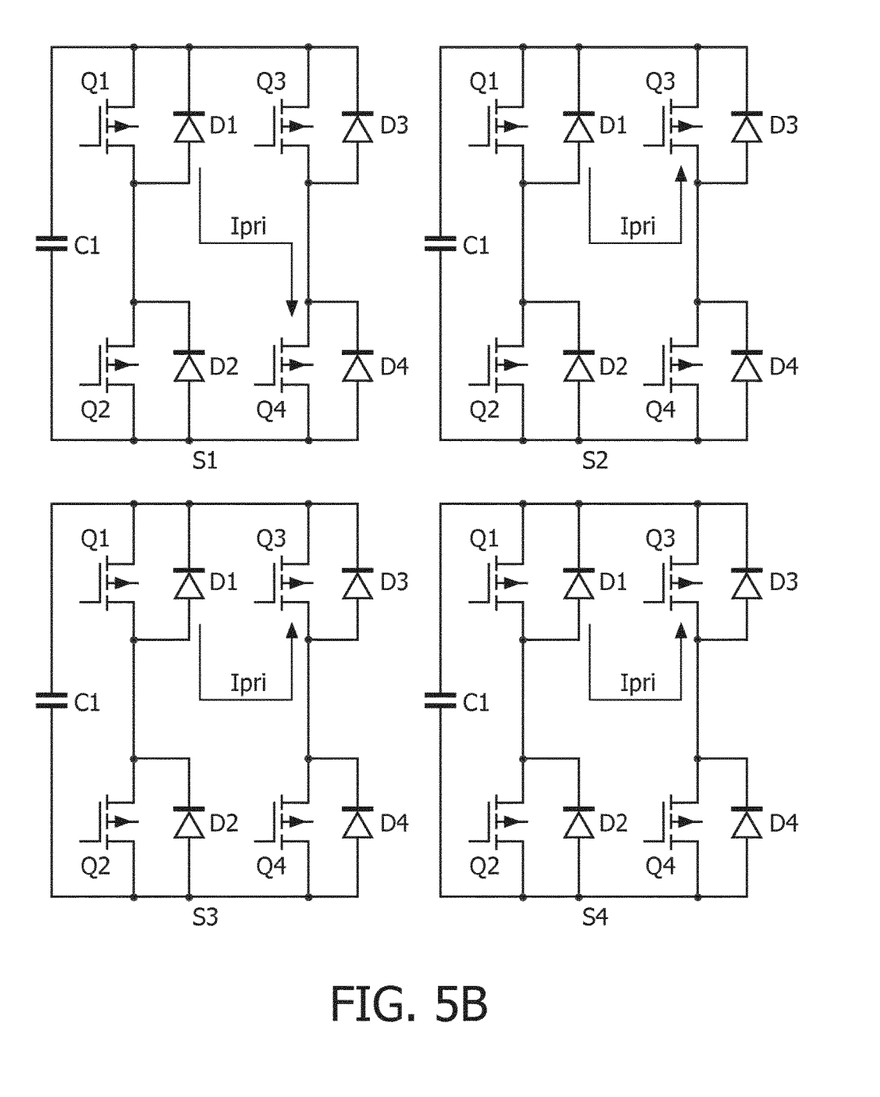
FIG. 5B illustrates switching states of transistors of an inverter in accordance with an embodiment of the present invention.

FIG. 5A illustrates exemplary drive signals for driving the switching transistors Q1 to Q4 of the inverter 410. FIG. 5B illustrates switching states of the transistors Q1 to Q4 of the inverter 410 during the on-level of the drive signal for Q1.

As shown in FIG. 5A, the drive signal for Q1 is a switching signal with a certain duty cycle. The on-level is the high-level of the drive signal and the off-level is the low-level of the drive signal in this example. The drive signal for Q2 should be opposite in phase with the drive signal for Q1 ideally. However in order to ensure that Q1 and Q2 in the same bridge leg do not turn on simultaneously, there is a period during which both drive signals for Q1 and Q2 are at off-level. This period is referred to as a dead time as the both transistors are at off state during this period. The drive signal for Q1 has 180° phase shift with the drive signal for Q4. And the drive signals for Q4 and Q3 in the same bridge leg has the same relationship as that of the drive signals for Q1 and Q2.

As shown in FIG. 5B in reference to FIG. 5A, during an on-level period of the drive signal for Q1, there are four states S1 to S4.

In the first state S1, the drive signal for Q4 is also at on-level, and thus Q1 and Q4 are switched on in this state and the current Ipri flows through Q1 and Q4 via the primary winding of the transformer 420 as shown in FIG. 4B.

In the second state S2, during the dead time of the drive signals for Q3 and Q4, both Q3 and Q4 are at off states, then the current Ipri flows or freewheels through the diode D3. Since the impedance of the diode is very small, the diode D3 provides a very small voltage close to zero across the transistor Q3 before the Q3 is switched on. In this way, when the Q3 is switched on, Q3 would consume almost no power. On the contrary, if the voltage across a transistor is high before the transistor is switched on, power loss would be caused by the transistor due to the voltage decrease from the high value to nearly zero when the transistor is switched on.

In the third state S3, the drive signal for Q3 is at on-level after the dead time, and Q3 is switched on. Because the transistor has much lower turn on voltage than the diode, the current Ipri flow through the transistor Q3 instead of continuing flowing through the diode D3. As the impedance of the transistor is smaller than that of the diode, the conduction power loss may be further reduced in this state.

In the fourth state S4, the drive signal for Q3 transfers from on-level to off-level while the drive signal for Q4 is still at the off-level. Similar as the second state, during this dead time of the drive signals for Q3 and Q4, the current Ipri flows through the diode D3.

Figure 5C:
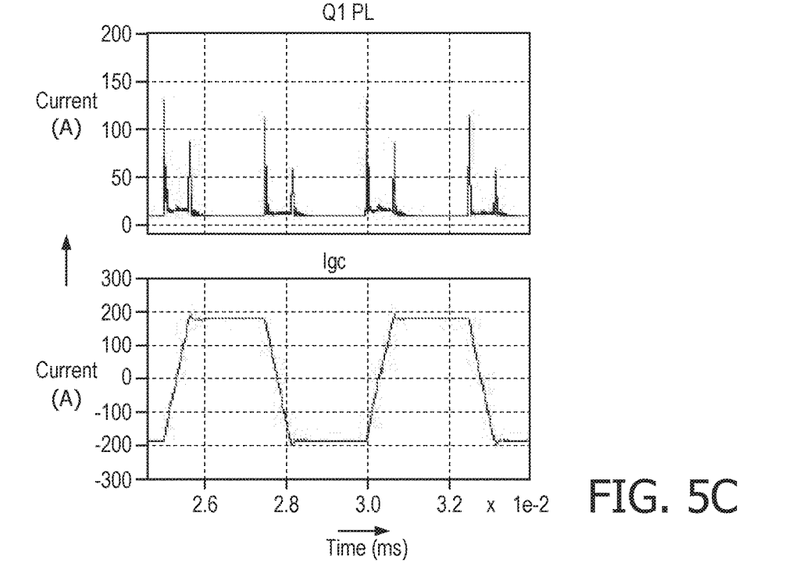
FIG. 5C illustrates power loss of a transistor of an inverter in accordance with an embodiment of the present invention.

In this example, the total loss for Q1 consists of conduction and switching loss, loss parameters for the transistor is list in the following Table 1, in which the transistor is a MOSFET. As shown in FIG. 5C, which shows the power loss PL of the transistor Q1 on the upper side and shows the gradient coil current Igc on the lower side, 12.6 W average loss occurs in Q1, such that for the four MOSFETs in the active power filter, 12.6×4=50.4 W loss will be generated, which is 30% lower than the traditional passive EMI filter, i.e., 72 W power loss for 1Ω for both R1 and R2.

TABLE 1

| Power MOSFET loss parameter | |
| --- | --- |
| IPT059N15N3 (MOSFET) | |
| Rds_on | 5 mΩ @ 150 A, Tj = 25° C. |
| Switching frequency | 400 KHz |
| Vbus | 100 V |
| Eon | 12 uJ |
| Eoff | 12 uJ |
| IPT059N15N3 (Diode) | |
| VF = 0.94 V | 0.94@150 A, Tj = 25° C. |
| Erec | 32 uJ |

Figure 5D:
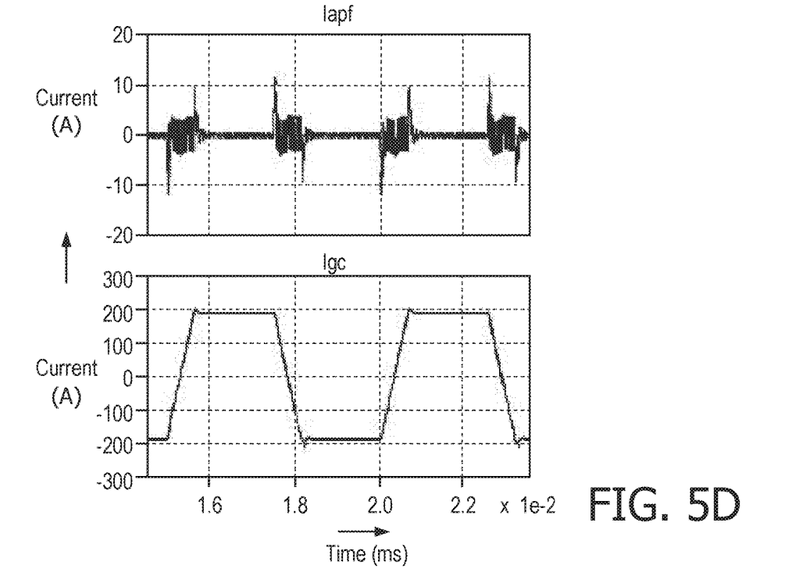
FIG. 5D illustrates compensation effect of an active power filter when gradient coil parameters have variations in accordance with an embodiment of the present invention.

In addition, with the same variation of gradient coil parameters as discussed above in conjunction with FIG. 2C, the active power filter can effectively compensate for the current oscillation while the power loss is not significantly increased. FIG. 5D illustrates the compensation effect of the active power filter in the case of having ±10% variation of the gradient coil parameters.

In the gradient amplifier system of the MRI system, the inverter 410 needs to be a high frequency inverter. Since the active power filter is used to compensate for the oscillation current, so the switching frequency of the inverter 410 needs to be much higher than the oscillation current. In an example, dominant oscillation current is 20 KHz, and thus the switching frequency of the inverter 410 may be selected to be 400 KHz. It should be noted that the switching frequency is not limited to a specific value. Further, by introducing 180° phase shift between the Q1 and Q4 drive signals, the equivalent output frequency of the voltage VAB between outputs A and B may be double. The relationship between the voltage VAB and the duty cycle D of the drive signals can be described as:

$$VAB = (2D-1) \times VBus \qquad \text{Equ. 1}$$

VBus is the DC supply voltage for the inverter 410 as shown in FIG. 4B.

In order to compensate the oscillation current, the active power filter 340 needs to generate a higher voltage than the gradient coil through the step up transformer 420. The gradient coil voltage is governed by:

$$Vcoil = Lcoil \frac{dIcoil}{dt} + Rcoil \times Icoil \qquad \text{Equ. 2}$$

Lcoil is the inductance of the gradient coil;
Icoil is the current of the gradient coil;
Rcoil is the resistance of the gradient coil.
Thus the active power filter needs to generate a voltage:

$$Vapf = Vcoil + 2\pi \times fosc \times ksc \times (L1+L2) \qquad \text{Equ. 3}$$

foscis the frequency of the oscillation current;
Iosc is the oscillation current;
L1 and L2 are the inductance of the inductors of the circuit 430.

The turn ration between the number of two secondary windings N2 and N3 and the number of primary winding N1 can be determined by:

$$\frac{N2}{N1} = \frac{N3}{N1} = \frac{\frac{1}{2} Vapf}{VBus} \qquad \text{Equ. 4}$$

In an example, the DC bus voltage supplied by the rectifier to the inverter 410 is controlled to be 100V, the turn ratio of the step up transformer 420 is 1:10:10, so that the output voltage of the inverter is boosted by the transformer to be ±1000V to drive the inductor circuit 430 such as two 47 uF inductors to generate the compensation current Iapf for compensating the oscillation current Iosc.

Figure 6A:
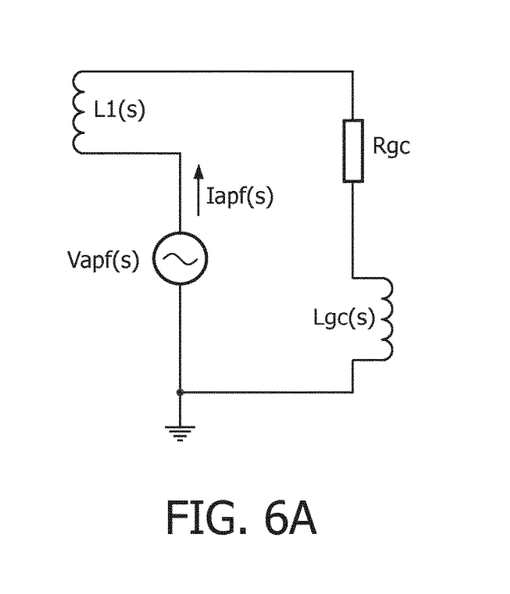
FIG. 6A illustrates an equivalent circuit model for an active power filter coupled with a gradient coil in accordance with an embodiment of the present invention.

FIG. 6A illustrates an equivalent circuit model for the active power filter 340 coupled with the gradient coil 330. The inverter 410 and the transformer 420 may be equivalent to a voltage source which output a voltage Vapf(s). The inductor circuit 430 may be equivalent to an inductance L1s which supplies the compensation current Iapf(s) under the driving of the voltage Vapf(s). The gradient coil 330 may be equivalent to a resistance Rgc and an inductance Lgc. the relationship between the output voltage Vapf(s) and duty cycle d(s) can be described in S domain as below:

$$\frac{Vapf(s)}{d(s)} = 2 \times VBus \times N \qquad \text{Equ. 5}$$

$$Iapf(s) \times (Lgc(s) + Rgc) = Vapf(s) \times \frac{Lgc(s) + Rgc}{(Lgc(s) + Rgc) + L1(s)} \qquad \text{Equ. 6}$$

$$Gid(s) = \frac{Iapf(s)}{d(s)} = \frac{2Vbus \times N}{Lgc(s) + Rgc + L1(s)} \qquad \text{Equ. 7}$$

Figure 6B:
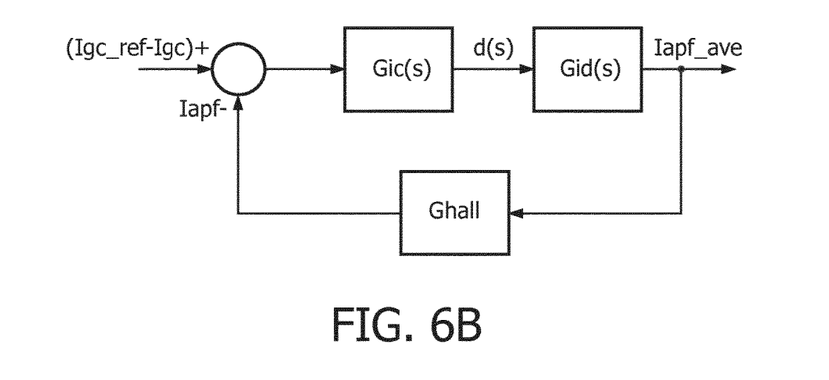
FIG. 6B illustrates an exemplary process for tracking a compensation current in accordance with an embodiment of the present invention.

FIG. 6B shows an exemplary process for tracking the compensation current Iapf. The process may be performed in a controller such as a DSP, CPU and so on. It should be understood that the tracking of the oscillation current is not limited to the specific process, other tracking algorithm may also be used.

As shown in FIG. 6B, the compensation current Iapf can be obtained based on the difference between the gradient coil reference current Igc_ref and the gradient coil feedback current Igc. The gradient coil reference current Igc_ref represents a predetermined current intended to be supplied to the gradient coil. The gradient coil current Igc represents a measured current flowing throw the gradient coil and is fed back to the controller. A sensor may be set at the gradient coil 330 to measure the gradient coil current Igc. Iapf represents the compensation current to be tracked.

As show in FIG. 6B, a proportional plus integral (PI) function Gic(s) may be used to determine the duty cycle d(s) based on the reference current of the gradient coil, the feedback current of the gradient coil, and the compensation current to be tracked, and specifically based on the difference of (Igc_ref−Igc) and Iapf. It should be understood that although PI function Gic(s) is employed for current tracking in this example, other control algorithm may also be used.

As shown in equation (7) and FIG. 6B, $$Gid(s) = \frac{Iapf(s)}{d(s)}.$$

The duty cycle d(s) is determined by Gic(s) and Iapf(s) is the measured compensation current and is fed back to the controller. A sensor may be set at an inductor of the inductor circuit 430 as show in FIG. 4B to measure the compensation current Iapf(s). The output of the Gid(s) is the tracked average compensation current Iapf_ave.

The function Ghall is a transfer function used to scale down the tracked compensation current output by Gid(s) to a value suitable to be processed by the Gic(s) function, for example, the function Ghall may be a constant value for scaling the output of Gid(s). Therefore the output of Ghall still represents the tracked compensation current Iapf.

Figure 6C:
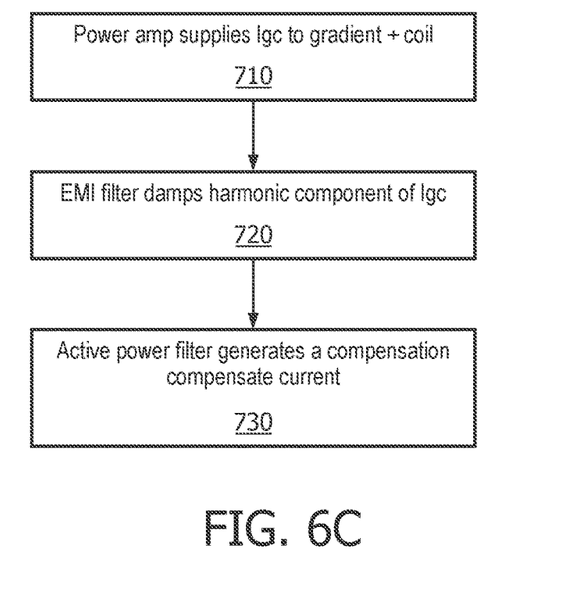
FIG. 6C illustrates a method for supplying a current to a gradient coil in a MRI system in accordance to an embodiment of the present invention.

FIG. 6C illustrates a method for supplying a current to a gradient coil in a MRI system in accordance to an embodiment of the present invention.

At block 710, a power amplifier 310 may supply a gradient coil current to a gradient coil 330. At block 720, an EMI filter 320 coupled to the power amplifier 310 may damp a harmonic component of the gradient coil current, wherein an oscillation current caused by oscillation of the passive filter 320 is present in the gradient coil current. At block 730, an active power filter 340 coupled between the EMI filter 320 and the gradient coil 330 may generate a compensation current to compensate the oscillation current.

In an embodiment, the active power filter 340 may generate the compensation current as shown in block 730 through the following steps: an inverter 410 of the active power filter 340 may generate a first voltage based on a difference between the gradient coil current and a predetermined reference current; a transformer 420 of the active power filter 340 may boost the first voltage to a second voltage; and an inductor circuit 430 of the active power filter 340 may be driven by the second voltage to generate the compensation current.

In an embodiment, the inverter 410 may be an H bridge inverter as shown in FIG. 4B. The inverter 410 may generate the first voltage by driving the high side transistor and the low side transistor in each of the first and second half bridges by drive signals to switch on alternately, wherein drive signals for the high side transistor in the first half bridge and the low side transistor in the second half bridge have the same duty cycle and a 180° phase shift with each other.

In an embodiment, in order to drive the inverter 410, a controller may generate the drive signals for the inverter. The duty cycle of the drive signals may be determined by the difference between the gradient coil current and the predetermined reference current. The controller may employ the tracking process as illustrated above in conjunction with FIGS. 6A and 6B in order to track the compensation current and accordingly generate the drive signals for the inverter. It should be understood that the present invention is not limited to the tracking method, various tracking methods may be employed to tracking the compensation current in the gradient amplifier system proposed in the present invention.

In addition to the method operations described above in conjunction with FIG. 6C, the method may include any operations described above in conjunction with FIGS. 3A to 6B.

It should be noted that the above-mentioned embodiments illustrate rather than limit the invention and that those skilled in the art would be able to design alternative embodiments without departing from the scope of the appended claims. In the claims, the word "comprising" does not exclude the presence of elements or steps not listed in a claim or in the description. The word "a" or "an" preceding an element does not exclude the presence of a plurality of such elements. The usage of the words first, second and et cetera, does not indicate any ordering. These words are to be interpreted as names.

The invention claimed is:

1. A gradient amplifier for a magnetic resonance imaging system, comprising
   a power amplifier, configured to supply a gradient coil current to a gradient coil;
   a passive filter coupled to the power amplifier and configured to damp a harmonic component of the gradient coil current, wherein an oscillation current caused by oscillation of the passive filter is present in the gradient coil current; and
   an active power filter coupled between the passive filter and the gradient coil and configured to generate a compensation current to compensate the oscillation current.

2. The gradient amplifier of claim 1, wherein the passive filter comprises an LC filter without using a damping resistor.

3. The gradient amplifier of claim 1, wherein the active power filter further comprises:
   an inverter configured to output a first voltage based on a difference between the gradient coil current and a predetermined reference current;
   a transformer configured to boost the first voltage to a second voltage; and
   an inductor circuit driven by the second voltage to generate the compensation current.

4. The gradient amplifier of claim 3, wherein the inductor circuit further comprises a first inductor and a second inductor, and the transformer comprises a first secondary winding and a second secondary winding, and wherein the first secondary winding, the first inductor, the gradient coil, the second inductor and the secondary winding are coupled in series sequentially, a junction node of the first and secondary windings is coupled to ground, and central of the gradient coil is coupled to ground.

5. The gradient amplifier of claim 3, further comprising a controller configured to generate a drive signal for the inverter, and wherein a duty cycle of the drive signal is determined by the difference between the gradient coil current and the predetermined reference current.

6. The gradient amplifier of claim 3, wherein the inverter comprises a H bridge inverter including a first half bridge with a high side transistor and a low side transistor coupled in series and a second half bridge with a high side transistor and a low side transistor coupled in series, and wherein the high side transistor and the low side transistor in each of the first and second half bridges are switched on alternately, and drive signals for the high side transistor in the first half bridge and the low side transistor in the second half bridge have the same duty cycle and a 180° phase shift with each other.

7. The gradient amplifier of claim 6, wherein each of the transistors in the H bridge inverter is coupled in parallel with an integrated diode.

8. The gradient amplifier of claim 1, wherein the compensation current and the oscillation current have the same magnitude, and wherein the compensation current and the oscillation current are out of phase with each other.

9. A magnetic resonance imaging system comprising a gradient amplifier according to claim 1.

10. A method for supplying a current to a gradient coil in a gradient amplifier of a magnetic resonance imaging system, comprising
    supplying, by a power amplifier, a gradient coil current to a gradient coil;
    damping, by a passive filter coupled to the gradient amplifier, a harmonic component of the gradient coil current, wherein an oscillation current caused by oscillation of the passive filter is present in the gradient coil current; and generating, by an active power filter coupled between the passive filter and the gradient coil, a compensation current to compensate the oscillation current.

11. The method of claim 10, wherein the active power filter comprises an inverter, a transformer and an inductor circuit, wherein the step of generating the compensation current further comprises:

generating, by the inverter, a first voltage based on a difference between the gradient coil current and a predetermined reference current;

boosting, by the transfornner, the first voltage to a second voltage; and driving the inductor circuit by the second voltage to generate the compensation current.

12. The method of claim 11, wherein the inductor circuit further comprises a first inductor and a second inductor, and the transformer comprises a first secondary winding and a second secondary winding, and wherein the first secondary winding, the first inductor, the gradient coil, the second inductor and the secondary winding are coupled in series sequentially, a junction node of the first and secondary windings is coupled to ground, and central of the gradient coil is coupled to ground.

13. The method of claim 11, further comprising generating, by a controller, a drive signal for the inverter, and wherein a duty cycle of the drive signal is determined by the difference between the gradient coil current and the predetermined reference current.

14. The method of claim 11, wherein the inverter comprises a H bridge inverter including a first half bridge with a high side transistor and a low side transistor coupled in series and a second half bridge with a high side transistor and a low side transistor coupled in series, wherein the generating the first voltage further comprises driving the high side transistor and the low side transistor in each of the first and second half bridges by drive signals to switch on alternately, and drive signals for the high side transistor in the first half bridge and the low side transistor in the second half bridge have the same duty cycle and a 180°0 phase shift with each other.

15. The method of claim 10, wherein the compensation current and the oscillation current have the same magnitude, and wherein the compensation current and the oscillation current are out of phase with each other.

* * * * *